United States Patent [19]

Lukaszek

[11] Patent Number: 5,315,145

[45] Date of Patent: May 24, 1994

[54] CHARGE MONITORING DEVICE FOR USE IN SEMICONDUCTOR WAFER FABRICATION FOR UNIPOLAR OPERATION AND CHARGE MONITORING

[75] Inventor: Wieslaw A. Lukaszek, Woodside, Calif.

[73] Assignee: Board of Trustees of the Leland Stanford Junior University, Stanford, Calif.

[21] Appl. No.: 93,430

[22] Filed: Jul. 16, 1993

[51] Int. Cl.[5] .................. H01L 27/02; H01L 29/68; H01L 29/78

[52] U.S. Cl. .................. 257/379; 257/317; 257/321

[58] Field of Search .............. 257/315, 316, 317, 321, 257/379

[56] References Cited

U.S. PATENT DOCUMENTS 5,065,201 11/1991 Yamauchi .......................... 257/315

OTHER PUBLICATIONS

Lukaszek et al., "Charm: A New Wafer Surface Charge Monitor," TechCon '90, San Jose.
Lukaszek et al., "Measurement of Process Induced Wafer Potentials," Ion Implantation Technology-92, copyright 1993, pp. 645–650.
Lukaszek et al., "Charging Studies Using the CHARM2 Wafer Surface Charging Monitor," Nuclear Instruments and Methods in Physics Research B74 (1993), pp. 301–305.
Lukaszek, "EEPROM-Based Charging-Effects Sensors for Plasma Etching and Ion Implantation," 1992 WLR Final Report, Oct. 25–28, 1992, pp. 101–105.
Lukaszek et al. "CHARM2: Towards an Industry—Standard Wafer Surface-Charge Monitor," Paper for the Center for Integrated Systems, Stanford University, Stanford, Calif. 94305 Sep. 30–Oct. 1992.

Primary Examiner—Ngan Ngo
Attorney, Agent, or Firm—Townsend and Townsend Khourie and Crew

[57] ABSTRACT

A unipolar charge monitoring device for use in characterizing semiconductor fabrication equipment and processes includes a semiconductor substrate of one conductivity type, a source region and a drain region formed in first and second spaced surface regions of opposite conductivity type in the substrate with a channel region between the source region and the drain region, a control gate spaced from and in alignment with the channel region, a floating gate between and spaced from said control gate and the channel region, a charge collection electrode above and electrically connected to the control electrode, and a diode connecting the charge collection electrode to the substrate whereby the charge collection electrode collects charge of only one potential. In one embodiment, the unipolar charge monitoring device further includes a conductive electrode spaced from the charge collecting electrode and ohmically connected to the substrate for monitoring surface charge dissipation. In other embodiments, the unipolar charge monitoring device floating gate is separated from the source region by a tunnel oxide, and a metal layer is spaced from the charge collection electrode and overlapping a portion of the charge collection electrode whereby the unipolar charge monitoring device monitors above-the-wafer charge conduction.

10 Claims, 5 Drawing Sheets

MAGNETRON PLASMA: $O_2$. 100mtorr, 200W, 20 SEC.

FIG. 7

ΔVt UV MONITOR

FIG. 8A

ΔVt OXIDE CURRENT MONITOR

FIG. 8B

CHARGE MONITORING DEVICE FOR USE IN SEMICONDUCTOR WAFER FABRICATION FOR UNIPOLAR OPERATION AND CHARGE MONITORING

BACKGROUND OF THE INVENTION

This invention relates generally to semiconductor product fabrication processes, and more particularly the invention relates to devices and methods for monitoring deleterious effects in semiconductor wafers due to charge induced damage during fabrication of integrated circuits and semiconductor devices.

It is known that semiconductor processes such as ion implantation, plasma etching, and other charged beam processing may cause damage in semiconductor wafers and the devices and circuits fabrication therein. To assess the damage-generating tendency of such processes, and to determine safe integrated circuit layout guidelines, the semiconductor industry has used polysilicon capacitors with varying gate oxide-field oxide ratios, edge-area ratios, and the like to statistically assess the manner and extent to which these parameters influence the degree of damage, and to develop or select more benign process options. However, due to the indirect nature of this monitoring procedure which relies on compiling frequency of oxide breakdown voltage or charge to breakdown statistics, the results have frequently been inconclusive and confusing.

Figure 1A:
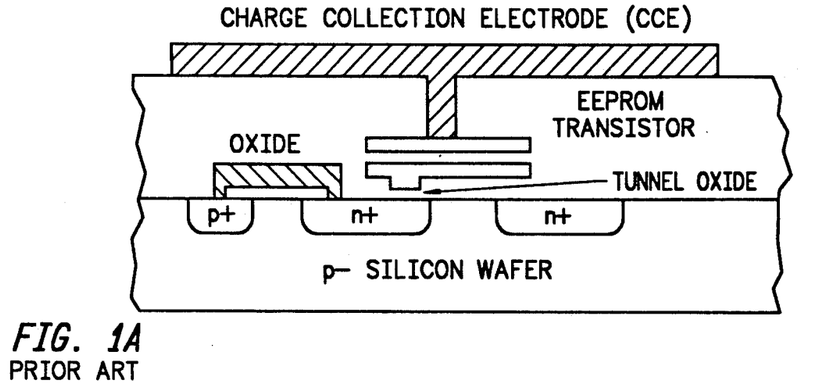
FIGS. 1A, 1B are section views, illustrating prior art EEPROM charge monitoring devices.
Figure 1B:
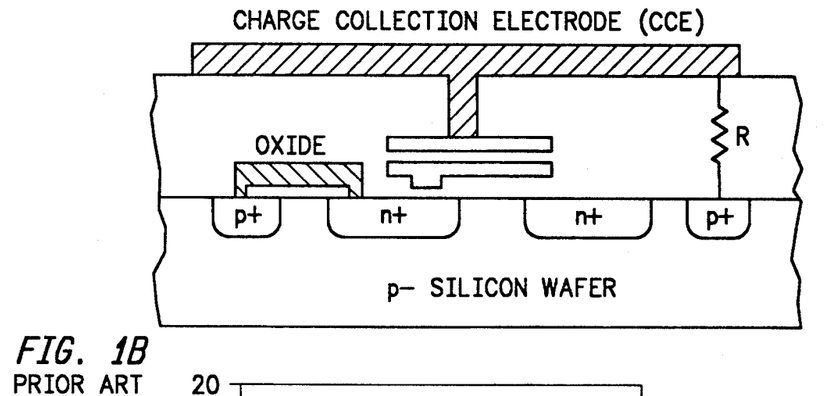
Figure 2:
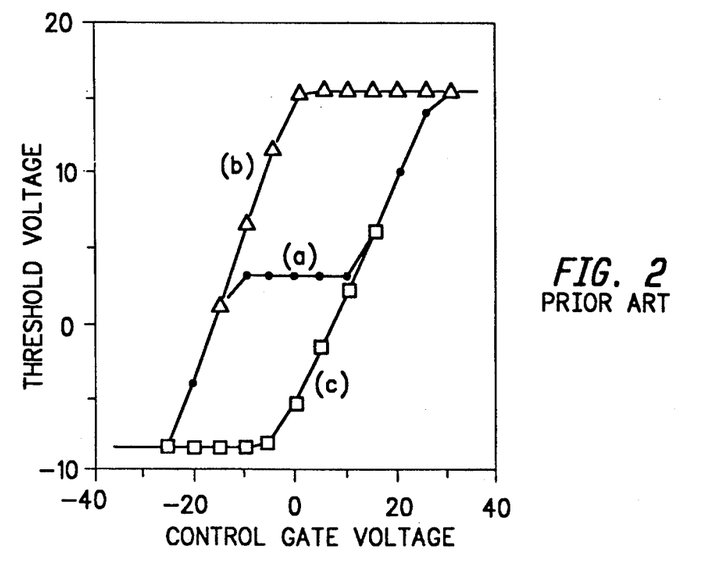
FIG. 2 is a plot of threshold voltage versus control voltage for the device of FIG. 1.

More recently, the Center for Integrated Systems at Stanford University has developed a monitor for use during plasma etching and high current arsenic implants, as described by Lukaszek et al., "CHARM, a New Wafer Surface Charge Monitor," Tech Con '90, San Jose. The charge monitor device uses electrically erasable PROM transistors as shown in FIG. 1 whose control gates are connected to aluminum charge collection electrodes located on thick oxide. Electrostatic charge deposited on the collection electrodes gives rise to a potential proportional to the amount of deposited charge and the collection electrode to substrate oxide thickness. This potential programs the EEPROM memory transistors by altering their threshold voltages in proportion to the potential on the charge collection electrodes. Therefore, the monitor is a polarity-sensitive peak voltage detector with memory. Its threshold voltage shift versus control gate potential, shown in curve A of FIG. 2, is determined during wafer probe by repeated application of external voltages to the charge collection electrodes.

Two undesirable characteristics may be observed in curve A: as manufactured, the EEPROM transistor does not respond to applied voltages between −10 volts and +10 volts, and the threshold voltage shift saturates for applied voltages lower than −25 volts or greater than +30 volts. The absence of response between −10 and +10 volts indicates that the applied potential is insufficient to cause electron tunneling through the thin tunnel oxide, while the saturation is due to reverse tunneling across the tunnel oxide when the floating gate potential is sufficiently low (or high) and the external programming voltage is removed. The lack of response between −10 volts and +10 volts can be circumvented by preprogramming the monitor transistors to their saturated threshold voltage state, where the transistors will respond to the slightest potential of the opposite polarity, as indicated in curves (b) and (c) of FIG. 2. Thus, the entire range of surface potential between −25 volts and +30 volts can be monitored by this device.

Early experimental results with this device indicate that the wafer charging during high current arsenic implants was best modeled by a voltage source whose polarity was negative. However, these bipolar, fast response charge monitoring devices leave unresolved the possibility of earlier occurrence of possibly detrimental positive transients whose signature was erased by subsequent negative transients. The use of unspecialized EEPROM to monitor charging effects during high current ion implants and plasma etching is inappropriate due to their bipolar sensitivity and convolved electrostatic and UV effects. Further, the structures described above appear to be inappropriate due to their bipolar response and excessively high sensitivity.

Ideally, a monitor is needed which gives a direct measure of the driving force behind the damage.

The present invention is directed to an improved charge monitoring device which overcomes limitations of the earlier EEPROM charge monitoring devices.

SUMMARY OF THE INVENTION

In accordance with the invention, a charge monitor device is provided which allows the measurement of both negative and positive transient effects. The EEPROM transistor monitor is modified to implement a unipolar monitor by providing a diode or a diode and resistor in series from the charge collection electrode to the semiconductor substrate in which the device is fabricated. Both n+p and p+n diodes can be used in respective monitors which are sensitive only to positive charge or only to negative charge.

Because the EEPROM transistors are very low capacitance structures, they register wafer surface potentials without regard to the ability of the medium to deliver a sufficient amount of charge to cause damage. Thus, in accordance with another feature of the invention, different size resistors are provided from the charge collection electrode to the substrate to effect voltage dividers between the equivalent impedance of the medium and the resistor.

In other embodiments of the invention, the range of sensitivity of UV monitors is varied by the shielding of an EEPROM transistor on different devices.

The invention and objects and features thereof will be more readily apparent from the following detailed description and appended claims when taken with the drawing.

DESCRIPTION OF SPECIFIC EMBODIMENTS

Figure 3A:
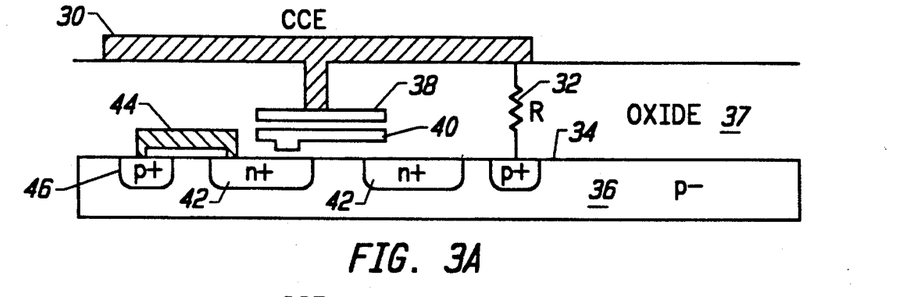
FIGS. 3A, 3B are section views of unipolar EEPROM charge monitor devices in accordance with the invention.
Figure 3B:
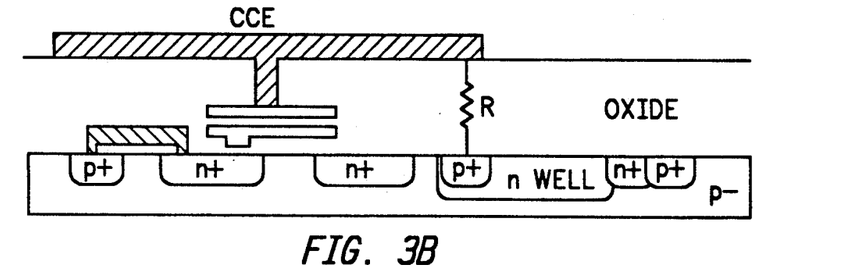

Referring now to FIGS. 3A, 3B, the charge monitoring device in accordance with the invention comprises an EEPROM memory device in which a diode or a diode and resistor are connected between the charge collection electrode to the semiconductor substrate in which the device is fabricated. More particularly, the charge collection electrode or control electrode 30 of the EEPROM is connected through a resistive path 32 through the n+p diode 34 to the P— substrate 36. The resistive path can be provided by doped polysilicon deposited in a hole etched through the silicon oxide 37, for example. The charge collection electrode is connected to the control electrode 38 of the EEPROM. The floating gate 40 is provided between the control electrode 38 and the source and drain regions 42, 44 of the EEPROM. In this embodiment, a tunnel oxide is provided between a projection of the floating gate 40 and the source region 42. Ohmic connection 44 and P+ region 46 provide an ohmic connection between the n+ source region 42 and the P— substrate 36. The monitor of FIG. 3A is sensitive only to positive charge.

FIG. 3B is similar to the device of FIG. 3A and like elements have the same reference numerals. However, in this embodiment, a P+N diode is serially connected between the substrate and the charge collection electrode 30 so that the monitor is sensitive only to negative charge.

The unipolar devices of FIGS. 3A, 3B provide for monitoring the peak value of a transient of a given polarity. Without the diodes, the EEPROM would record the peak value of the last transient, if sufficiently strong, while erasing any record of a transient of the opposite polarity which may have occurred earlier.

Figure 4:
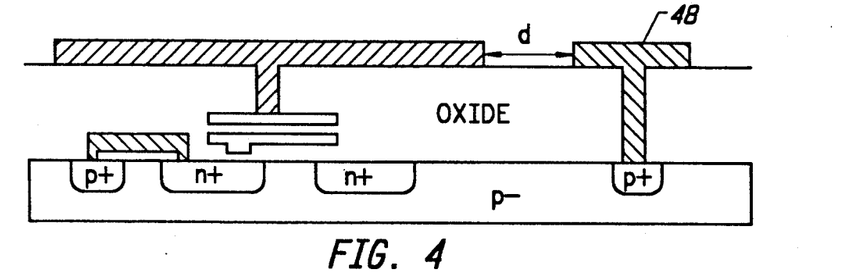
FIG. 4 is a section view of a unipolar charge monitoring device for monitoring lateral conduction in accordance with one embodiment of the invention.

It is also very important to know how charge deposited on the surface of a wafer is dissipated. For example, if there are adjacent structures connected to the substrate, and there is surface (or above the surface) conduction on the wafer, then the proximity of these structures to the charge collection electrode will affect the measurements. To monitor these effects, the device of FIG. 4 has charge collection electrodes surrounded by guard rings 48 of different spacings, ohmically connected to the substrate.

Figure 5:
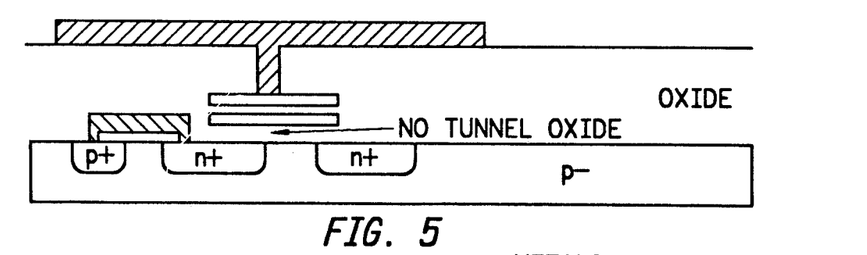
FIG. 5 is a section view of a UV assisted oxide conduction unipolar monitor in accordance with another embodiment of the invention.

UV-assisted vertical conduction in oxides, on the other hand, is monitored by devices whose floating gate transistor does not contain the thin tunnel oxide, as shown in FIG. 5. In this case, the transistor will not respond to surface potentials less than 55 V. However, in the presence of UV, a response will be observed at much lower voltages.

Figure 6:
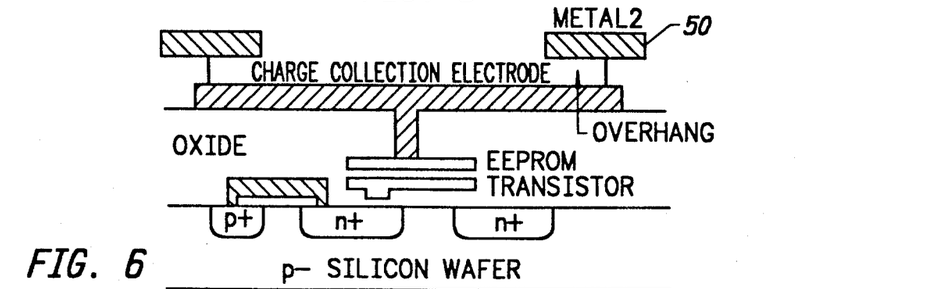
FIG. 6 is a section view of an above-the-wafer charge conduction monitor in accordance with another embodiment of the invention.

FIG. 6 illustrates another embodiment of the invention useful in monitoring above the wafer charge conduction due to secondary electrons and plasmas. A second level metal 50 is provided above the charge collection electrode 30 with the oxide between the first and second level metal being undercut thereby effectively eliminating the presence of surfaces which can be reached by energetic ions or UV and eliminating the possibility of surface conduction effects. The UV aided vertical conduction effects are eliminated by the second level metal, which blocks UV penetration. Consequently, only above the surface charge conduction is monitored by this device.

Figure 7:
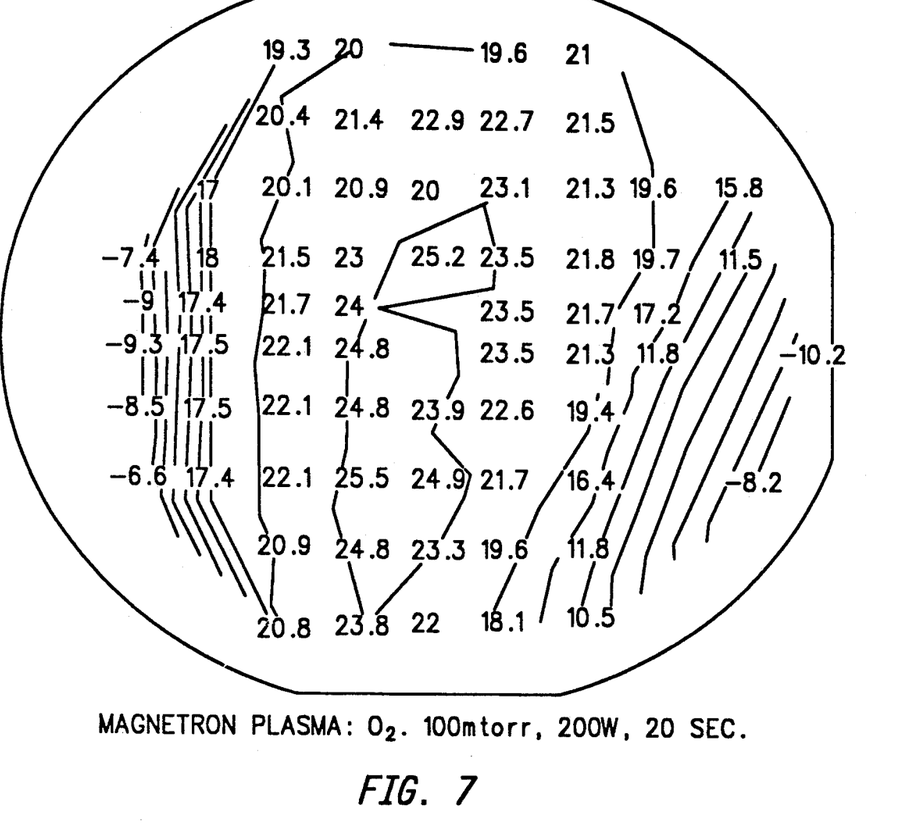
FIG. 7 is a plot of surface potential in a nonuniform oxygen plasma as monitored with the unipolar charge monitoring device.

Consider now results obtained under different experimental conditions. First, look at the distribution of surface potential on a wafer exposed to a deliberately disturbed oxygen plasma (FIG. 7.) In this case, a bar magnet was deliberately placed under the wafer, to cause an imbalance in the electron and ion fluxes reaching the wafer. Under these conditions, it was expected that the magnetic field over the wafer would cause more ions than electrons to reach the center of the wafer, while the opposite would be true at the edges of the wafer. This, indeed, is supported by the surface potential wafer map in FIG. 7, where positive charging is observed in the center of the wafer, while negative charging is observed at the left and right edges of the wafer. It is this kind of imbalance of electron and ion fluxes which causes damage in many plasma-based processes.

Figure 8A:
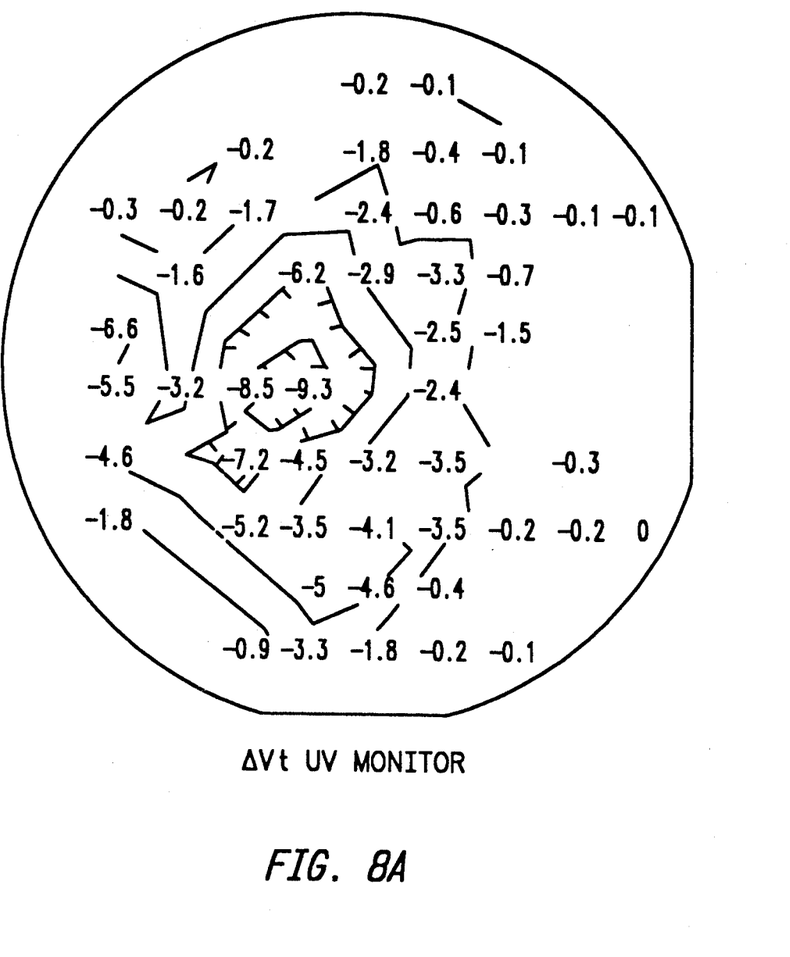
FIGS. 8A, 8B are plots illustrating UV effects as monitored with the device.
Figure 8B:
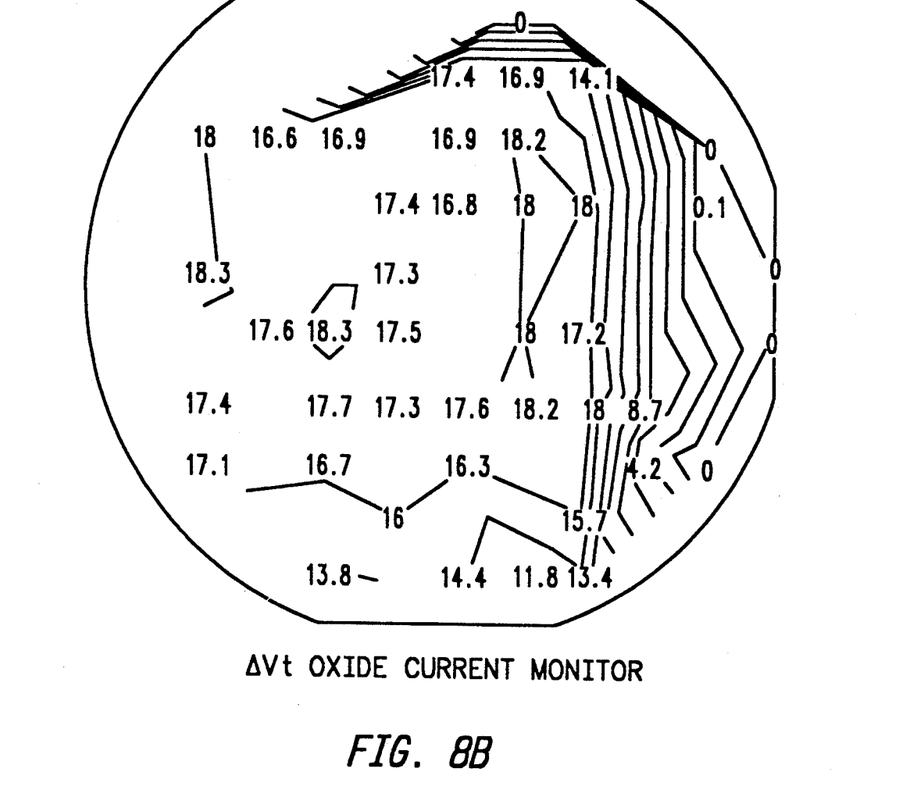

Consider now UV effects. In FIG. 8A, the wafer map shows the distribution of the change in threshold voltage of a UV monitor, which is proportional to the integrated UV dose reaching the wafer during the course of a high-current Arsenic implant. As can be seen from the wafer map of FIGS. 8A, 8B, the intensity of the UV is greatest at the center of the wafer, and zero at the extreme right of the wafer. In accordance with expectations, the change of the threshold voltage of the floating gate transistor without the tunnel oxide (the UV-assisted oxide conduction monitor) is also greatest in the center of the wafer, and is zero, or nearly zero, at the extreme right of the wafer. From the polarity of the threshold voltage shift, it can be seen that the accompanying surface potential was negative. Clearly, in the presence of UV, vertical conduction in the oxide is observed, while in the absence of UV, there was no conduction in the oxide under these conditions. The surface potential was simply not large enough to cause any noticeable tunneling effects.

Consider now transients effects. TABLE 1 shows the mean surface potential recorded by different structures during the course of the same Arsenic implant. The voltages indicated next to the structure descriptions are the gate potentials applied to the different structures prior to the experiment, to suitably pre-set the threshold voltages of the EEPROM transistors. From the post-experiment values of surface potential recorded by the first two structures, it appears that a negative charging event occurred, and that it seems to exhibit a current-source behavior (since the device whose charge collection electrode was on 0.6 $\mu$m oxide recorded a lesser potential). Although it may appear that the same information is available from the threshold voltages of the next two structures, the fact that the (erroneously) inferred surface potential is lower than the programming potential suggests that a positive charging event must also have occurred. Indeed, this is confirmed by the unipolar monitor, containing the n+p diode, which recorded a positive charging event whose potential was in excess of +25V. Moreover, the peak current density of this charging event, inferred from the 9 volt drop across the 1.8 M$\Omega$ resistor of the structure containing the resistor-loaded charge collection electrode, was 2 mA/cm$^2$. Depending on the integrity of the gate oxide, this could have been a potentially destructive event. Moreover, the lack of response on the resistor-containing structure with the small charge collection electrode suggests that the positive charging event was a current source. Since the corresponding structures sensitized to detect negative charging events (i.e., pre-programmed with +22V) showed no response, the negative charging event was much weaker that the positive charging event. All of this is in accordance with the current understanding of wafer charging phenomena during high-current source/drain implants.

TABLE 1

Transient Effects
Arsenic: 6 mA, 80 kV, 5e15, bias, no flood, resist on CCE

| Monitor Type | CCE Potential |
|---|---|
| Large CCE (+22 V) | −20 V |
| Large CCE on 0.6 μm oxide (+22 V) | −17 V |
| Large CCE (−21 V) | −20 V |
| Large CCE on 0.6 μm oxide (−21 V) | −17 V |
| Small CCE, resistor, n + p diode (−21 V) | >25 V |
| Large CCE, 1.8 MΩ resistor (−21 V) | +9 V |
| Small CCE, 1.8 MΩ resistor (−21 V) | no response |
| Large CCE, 1.8 MΩ resistor (+22 V) | no response |

Conclusions:
Positive charging event did occur
Positive charging event is a current source
Magnitude of positive current source is 2 mA/cm$^2$
Negative charging event is weaker than positive event Consider now some photoresist effects. TABLE 2 shows the mean surface potential recorded by different structures during the same Arsenic implant, observed on a bare wafer and a wafer whose charge collection electrodes were covered by photoresist. The response of the simple "antenna" monitors of FIGS. 1A, 1B shows very little difference between the bare and the resist-covered wafer. However, as previously mentioned, the n+p diode-containing structure on the resist covered wafer recorded a positive transient whose peak potential was in excess of 25V, and whose peak current density was 2 mA/cm$^2$. The same structure on the bare wafer recorded a much weaker transient. In fact, the collected current was so small that it was discharged by the reverse leakage current of the n+p diode. It was observed, however, on the resistor-loaded charge collection structure employing a 1.2 TΩ resistor. Clearly, the positive transient on the resist-covered wafer was many orders of magnitude more destructive than on the bare wafer. The opposite trend is observed regarding the negative transient (as can be seen from the structures whose threshold voltage was pre-set with +22 V), which was stronger on the bare wafer, as can be seen from the response of the structure with the p+n diode, and from the substantially lower value of the resistor needed by the resistor-loaded charge collection electrode structure to record this event. However, both the negative and positive charging events had negligible destructive power, compared to the positive charging event on the wafer whose charge collection electrodes were covered with resist. This leads to the conclusion that the resist-covered transistors are subject to a greater destructive stress during Arsenic source/drain implants than the transistors being implanted.

TABLE 2

Example: Photoresist Effects
Arsenic: 6 mA, 80 kV, 5e15, bias, no flood
Mean CCE potentials on CHARM2 devices:

| Monitor Type | No Resist | Resist (CCE) |
|---|---|---|
| L CCE (+22) | −18 V | −20 V |
| S CCE, p + n diode (+22) | −12 V | no data |
| S CCE, n + p diode (−22) | no response | >25 V |
| L CCE, resistor (+22) (R) | −12 (44 GΩ) | no response (1.8 MΩ) |
| L CCE, resistor (−22) | +12 | +9 |

TABLE 2-continued

Example: Photoresist Effects
Arsenic: 6 mA, 80 kV, 5e15, bias, no flood
Mean CCE potentials on CHARM2 devices:

| Monitor Type | No Resist | Resist (CCE) |
|---|---|---|
| (R) | (1.2 TΩ) | (1.8 MΩ) |

Conclusions:
Photoresist increases charging by orders of magnitude
No photoresist: negative charging dominates (negligible)
Photoresist: positive charging dominates (potentially destructive)

There have been described several embodiments of a new and improved unipolar surface charge monitor and use thereof in characterizing various charged beam fabrication apparatus. While the invention has been described with reference to specific embodiments, the description is illustrative of the invention and is not to be construed as limiting the invention. Various modifications and applications may occur to those skilled in the art without departing from the true spirit and scope of the invention as defined by the appended claims.

What is claimed is:

1. A unipolar charge monitoring device for use in characterizing semiconductor fabrication equipment and processes comprising:
   a semiconductor substrate of one conductivity type,
   a source region and a drain region formed in first and second spaced surface regions of opposite conductivity type in said substrate with a channel region between said source region and said drain region,
   a control gate spaced from and in alignment with said channel region,
   a floating gate between and spaced from said control gate and said channel region,
   a charge collection electrode above and electrically connected to said control electrode, and
   diode means connecting said charge collection electrode to said substrate whereby said charge collection electrode collects charge of only one potential.

2. The unipolar charge monitoring device as defined by claim 1, wherein said diode comprises a third surface region in said substrate of said opposite conductivity type and conductive means connecting said charge collection electrode and said third surface region.

3. The unipolar charge monitoring device as defined by claim 2, wherein said conductive means comprises a resistor.

4. The unipolar charge monitoring device as defined by claim 2, wherein said one conductivity type is p type, said opposite conductivity type is n type, and said device monitors positive charge.

5. The unipolar charge monitoring device as defined by claim 1, wherein said diode means comprises a surface well of opposite conductivity type formed in said substrate, a third surface region of said one conductivity type formed in said well, and conductive means connecting said charge collection electrode and said third surface region.

6. The unipolar charge monitoring device as defined by claim 5, wherein said conductive means comprises a resistor.

7. The unipolar charge monitoring device as defined by claim 5, wherein said one conductivity type is p type, said opposite conductivity type is n type, whereby said charge collection electrode collects negative charge.

8. A charge monitoring device for use in characterizing semiconductor fabrication equipment and processes comprising:

a semiconductor substrate of one conductivity type, a source region and a drain region formed in first and second spaced surface regions of opposite conductivity type in said substrate with a channel region between said source region and said drain region, a control gate spaced from and in alignment with said channel region, a floating gate between and spaced from said control gate and said channel region, a charge collection electrode above and electrically connected to said control electrode, and a conductive electrode spaced from said charge collecting electrode and ohmically connected to said substrate for monitoring surface charge dissipation.

9. The unipolar charge monitoring device as defined by claim 1, wherein said floating gate is separated from said source region by a tunnel oxide.

10. A charge monitoring device for use in characterizing semiconductor fabrication equipment and processes comprising:

a semiconductor substrate of one conductivity type, a source region and a drain region formed in first and second spaced surface regions of opposite conductivity type in said substrate with a channel region between said source region and said drain region, a control gate spaced from and in alignment with said channel region, a floating gate between and spaced from said control gate and said channel region, a charge collection electrode above and electrically connected to said control electrode, and a metal layer spaced from said charge collection electrode and overlapping a portion of said charge collection electrode whereby said unipolar charge monitoring device monitors above-the-wafer charge conduction.

* * * * *

UNITED STATES PATENT AND TRADEMARK OFFICE
CERTIFICATE OF CORRECTION

PATENT NO. :  5,315,145

DATED       :  May 24, 1994

INVENTOR(S) :  WIESLAW A. LUKASZEK

It is certified that error appears in the above-identified patent and that said Letters Patent is hereby corrected as shown below:

<u>IN THE DRAWINGS</u>:

FIG. 3A, region 34 should be n+.

Column 1, line 18, change "fabrication" to --fabricated--.

Signed and Sealed this

Seventh Day of March, 1995

Attest:

BRUCE LEHMAN

*Attesting Officer*       *Commissioner of Patents and Trademarks*